(12) United States Patent
Arai et al.

(10) Patent No.: US 6,181,101 B1
(45) Date of Patent: Jan. 30, 2001

(54) INTELLIGENT JUNCTION BOX

(75) Inventors: Yoichi Arai; Syuji Satake, both of Shizuoka-ken (JP)

(73) Assignee: Yazaki Corporation, Tokyo (JP)

( * ) Notice: Under 35 U.S.C. 154(b), the term of this patent shall be extended for 0 days.

(21) Appl. No.: 09/522,167

(22) Filed: Mar. 9, 2000

(30) Foreign Application Priority Data

Mar. 12, 1999  (JP) ................................................ 11-067534

(51) Int. Cl.$^7$ .................................................................. H01M 10/46
(52) U.S. Cl. .............................................................................. 320/104
(58) Field of Search ...................................... 320/104, 123, 320/128, 132, 135, 149

(56) References Cited

U.S. PATENT DOCUMENTS 4,262,209 * 4/1981 Borner .
5,406,195 * 4/1995 Schweitzer, Jr. .
5,898,557 * 4/1999 Baba et al. .

FOREIGN PATENT DOCUMENTS 5-278535  10/1993  (JP) .
6-98477   4/1994   (JP) .
6-255431  9/1994   (JP) .

* cited by examiner

*Primary Examiner*—Edward H. Tso
(74) *Attorney, Agent, or Firm*—Finnegan, Henderson, Farabow, Garrett & Dunner, L.L.P.

(57) ABSTRACT

A junction box provided between a high voltage battery and a load supplies a high voltage to the load, generates a predetermined low voltage from that high voltage and supplies the low voltage to a low voltage battery and load. If over-current flows through the high voltage system circuit or low voltage system circuit, the junction box shuts off an input of the high voltage. The junction box is provided with an over-voltage countermeasure circuit which even if an over-voltage exceeding 36 V is supplied from the high voltage battery, suppresses it to a predetermined high voltage and outputs. Further, the junction box includes a controller for estimating a remaining capacity of each of the high voltage battery and low voltage battery by detecting respective voltages and currents of the high voltage system circuit and low voltage system circuit.

6 Claims, 8 Drawing Sheets

INTELLIGENT JUNCTION BOX

BACKGROUND OF THE INVENTION

1. Field of the Invention

The present invention relates to an intelligent junction box for converting and distributing a power voltage into plural voltages and supplying them to loads.

2. Description of the Related Art

Figure 1:
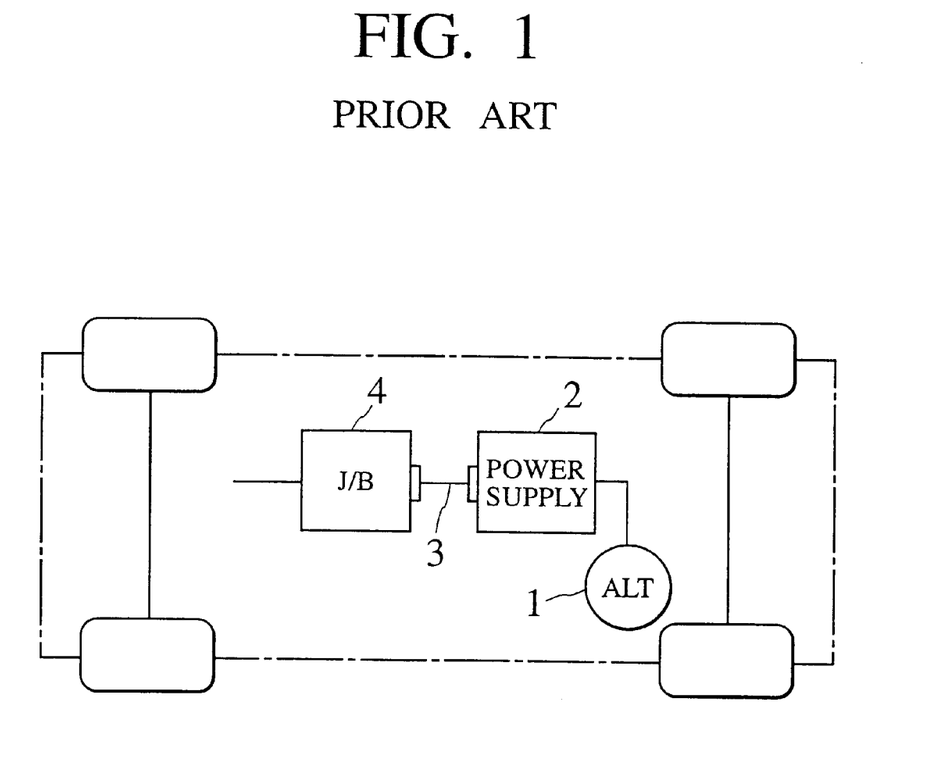
FIG. 1 is an explanatory diagram for explaining a conventional junction box for use in a vehicle.

In an ordinary vehicle, as shown in FIG. 1, a battery 2 is charged by an alternator 1. An electric power from this battery 2 is introduced to a junction box (J/B) 4 via a cable (harness) 3. The junction box 4 distributes an electric power to respective loads (lamp, meter).

In an electric vehicle also, the junction box 4 like the aforementioned one is used. The junction box 4 of the electric vehicle is provided with a control relay circuit or the like for feeding a large current.

That is, because the conventional junction box is used basically for distributing an electric power (voltage), a protective circuit for preventing an over-current due to a short-circuit or the like is absolutely necessary.

SUMMARY OF THE INVENTION

Accordingly, the present invention has been achieved to solve the above problem, and therefore, it is an object of the present invention to provide an intelligent junction box capable of carrying out stabilized distribution of electric power without provision of any protective circuit or the like on a load side and having a function capable of measuring a remaining capacity of a power supply.

To achieve the above object, there is provided a junction box disposed between a high voltage battery and a load and on which a predetermined high voltage is impressed by the high voltage battery, the box comprising: a high voltage system circuit pattern which receives the predetermined high voltage and supplies it to the load; a high voltage system circuit shut-off relay for shutting off the high voltage system circuit; a high voltage system voltage/current detecting portion for detecting a voltage impressed on the high voltage system circuit pattern and a current flowing therein; a voltage converter which receives a voltage from a post stage of the high voltage system circuit shut-off relay of the high voltage system circuit pattern and generates and outputs at least one predetermined low voltage based on that voltage; a low voltage circuit pattern which receives the at least one predetermined low voltage and supplies it to a low voltage battery and the load; a low voltage system voltage/current detecting portion for detecting a voltage impressed on the low voltage circuit pattern and a current flowing therein; and a controller for, if a current flowing through the high voltage system circuit pattern detected by the high voltage system voltage/current detecting portion is over a first predetermined value or a current flowing through the low voltage system circuit pattern detected by the low voltage system voltage/current detecting portion is over a second predetermined value, controlling the high voltage system shut-off relay to shut off the high voltage system circuit pattern.

According to a preferred embodiment, the junction box of the present invention further comprises an over-voltage countermeasure circuit which is provided at a forefront stage of the high voltage system circuit pattern and even if a voltage over a third predetermined value is inputted, outputs the predetermined high voltage to a post stage.

According to a preferred embodiment, the junction box of the present invention further comprises an over-voltage countermeasure circuit which is provided at a forefront stage of the high voltage system circuit pattern and even if a voltage over a fourth predetermined value is inputted, outputs the at least one predetermined low voltage to a post stage.

According to a preferred embodiment of the present invention, the controller comprises: an estimating means for estimating a remaining capacity of the high voltage battery based on a voltage and a current detected by the high voltage system voltage/current detecting portion; and an estimating means for estimating a remaining capacity of the low voltage battery based on a voltage and a current detected by the low voltage system voltage/current detecting portion.

According to a preferred embodiment of the present invention, the controller, if a remaining capacity of the high voltage battery is estimated to be lower than a predetermined value, supplies a control signal for starting charging to an alternator, which supplies a charging voltage to the high voltage battery.

According to a preferred embodiment of the present invention, the voltage converter generates and outputs AC low voltage.

The nature, principle and utility of the invention will become more apparent from the following detailed description when read in conjunction with the accompanying drawings.

BRIEF DESCRIPTION OF THE DRAWINGS

In the accompanying drawings:

FIG. 5 (5A & 5B) is an explanatory diagram for explaining a method for estimating a remaining capacity of each of two battery systems:

DESCRIPTION OF THE PREFERRED EMBODIMENTS

FIRST EMBODIMENT

Figure 2:
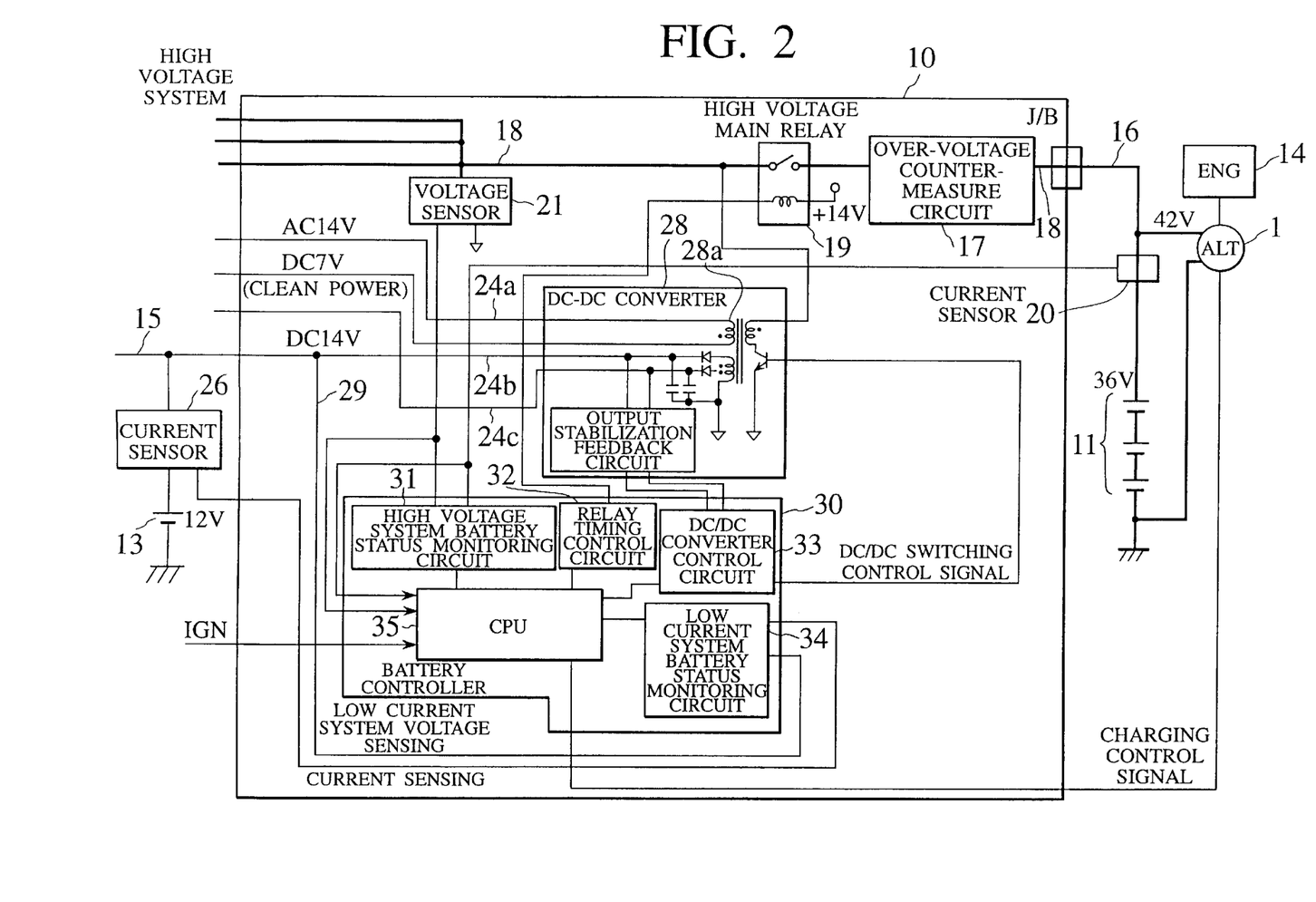
FIG. 2 is a schematic structure diagram of a junction box according to a first embodiment.

FIG. 2 is a schematic structure diagram of an intelligent junction box according to a first embodiment.

The intelligent junction box 10 (hereinafter refereed as junction box) shown in FIG. 2 is mounted on a high voltage using vehicle provided with a high voltage battery 11 for 36 V and a low voltage battery 13 for 12 V. That is, a relationship of both the batteries is 1:3.

This high voltage battery 11 is connected in parallel to the alternator 1 having a 42 V output connected to an engine 14 (ENG). The low voltage battery 13 is provided in a downstream of the junction box 10 and charged by an output (14 V) from this junction box 10.

That is, the low voltage battery 13 is connected to an output terminal of DC14 V of the junction box 10 via a cable 15 and a high voltage battery 11 is connected to an input terminal of the junction box 10 via a cable 16.

A high voltage pattern 18 (indicated by a bold line) for transmitting a high voltage of 36 V to the inside is provided on a substrate in the junction box 10. In this pattern 18 (high voltage system), a current sensor 20, an over-current countermeasure circuit 17 for a high voltage, a high voltage main relay 19 and a voltage sensor 21 (insulation type) are installed.

The over-current countermeasure circuit 17, pattern 18 and high voltage main relay 19 are totally called high voltage system portion.

Further, the junction box 10 is provided with a DC—DC converter 28 which receives a first voltage of high voltage outputted from the high voltage main relay 19 to obtain plural kinds of low voltages.

That is, this junction box 10 is used as a down converter for the low voltage battery 13.

System Configuration

Figure 3:
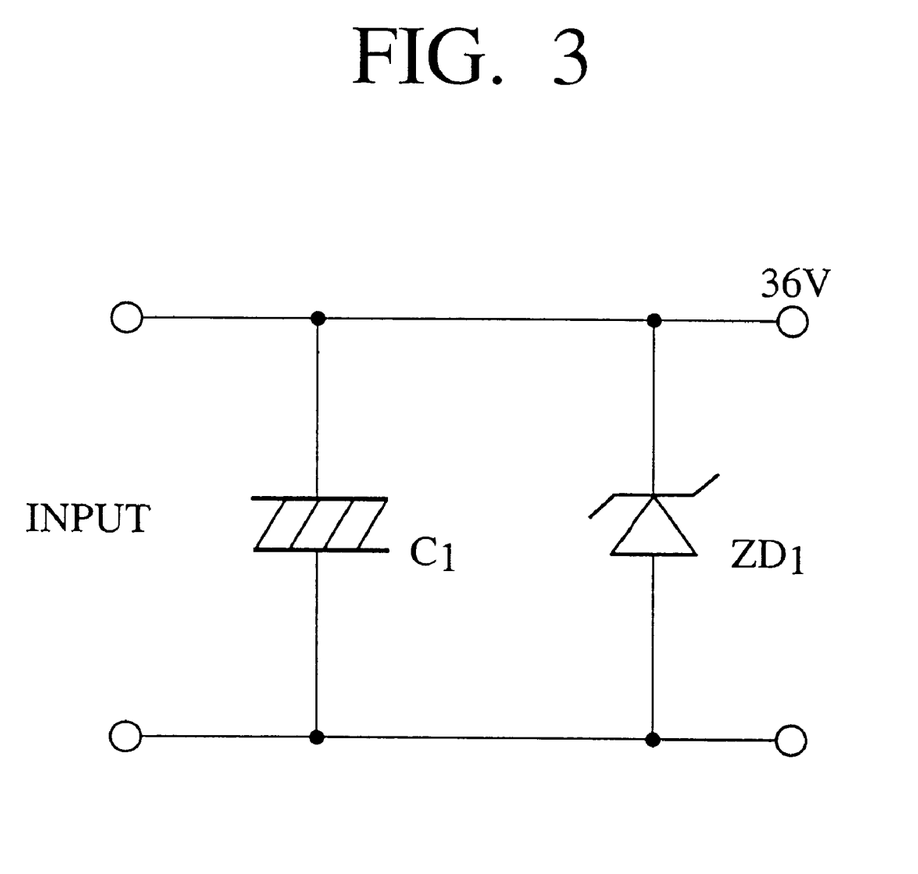
FIG. 3 is a schematic structure diagram of an over-voltage countermeasure circuit for a high voltage.

As shown in FIG. 3 for example, the aforementioned over-voltage countermeasure circuit 17 for a high voltage is comprised of a Zener diode ZD1 and an electric capacitor C1 (although a resistor, other capacitor and the like are provided additionally, only main components are indicated in this example). Even if an over-voltage exceeding 36 V is produced due to abnormality of the alternator 1 or the like, 36 V is always maintained.

The DC-DC converter 28 comprises a transformer, diode, capacitor, switching element, output stabilization feedback circuit and the like as shown in FIG. 2 so as to obtain DC14 V (this is 12 V in a low voltage battery), DC7 V and AC14 V. The AC14 V is realized by not connecting a capacitor, diode and the like to a coil 28a.

This AC14 V is sent out via a pattern 24a connected to an output of the DC-DC converter 28. Further, the DC14 V is sent out to a low voltage battery 13 via a pattern 24b connected to the output of the DC-DC converter 28.

The DC7 V is sent out via a pattern 24c connected to the output of the DC-DC converter 28.

The DC-DC converter 28 and the patterns 24a, 24b, 24c are totally called low voltage system portion.

A battery controller 30 comprises a high voltage system battery status monitoring circuit 31, a relay timing control circuit 32, a DC/DC converter control circuit 33, a low current system battery status monitoring circuit 34, CPU and the like.

The high voltage system battery status monitoring circuit 31 reads a current of the current sensor 20 and a voltage of the voltage sensor 21 and determines whether or not the battery 11 for 36 V is fully charged. This determination is carried out by for example, setting a predetermined threshold value preliminarily and comparing an inputted voltage with that threshold value.

The relay timing control circuit 32 turns off the high voltage main relay 19 immediately when the CPU 35 recognizes an over-current (due to short-circuit, abnormal load or the like) from a current value from the high voltage pattern 18. Further, if the CPU 35 recognizes ignition ON, the relay timing control circuit 32 turns ON the high voltage main relay 19 in a predetermined interval.

The DC/DC converter control circuit 33 reads voltages at the 14 V output terminal and 7 V output terminal of the DC—DC converter 28 and controls the duty ratio of the switching control signal so that these voltage values approach a reference value (14 V, 7 V).

A voltage divider (not shown) is connected to the pattern 29 for low current system voltage sensing. The low current system battery status monitoring circuit 34 detects a voltage at this dividing point so as to detect a voltage impressed on the 12 V battery 13, and at the same time, reads a current in the low current system current sensor 26 so as to determine whether or not the 12 V battery 13 is fully charged.

Description of the Operation

An operation of the junction box 10 having such a structure will be described.

The role of the alternator 1 in the power supply system is to supply an electric power to be consumed in an electric load of a vehicle when the engine is running and keep the charging status of the battery in an excellent condition by charging the batteries 11, 13 (maintaining a sufficient electric potential for starting the engine next).

After the ignition ON, the CPU 35 of the battery controller 30 in the junction box 10 turns OFF the high voltage main relay 19 in a predetermined while using the relay timing control circuit 32 and then turns ON the high voltage main relay 19.

At the same time, an electric power from the 36 V battery 11 is supplied to a load (not shown) via the pattern 18 in the junction box 10, the current sensor 20, the over-voltage countermeasure circuit 17, the high voltage main relay 19 and the voltage sensor 18.

At the time, if any error occurs in the load or the alternator 1 so that a voltage several times 36 V is supplied, this over-voltage is suppressed by the Zener diode ZD1 of the over-voltage countermeasure circuit 17 and thus a stabilized high voltage of 36 V is supplied to the load side.

On the other hand, the DC-DC converter 28 inputs a first high voltage into the input terminal from the high voltage main relay 19 and consequently, AC14 V, DC14 V and DC7 V are obtained at the output terminals depending on the number of windings of the coil, capacitor, diode, switching element and the like.

This DC-DC converter 28 is controlled by the battery controller 30.

Figure 4:
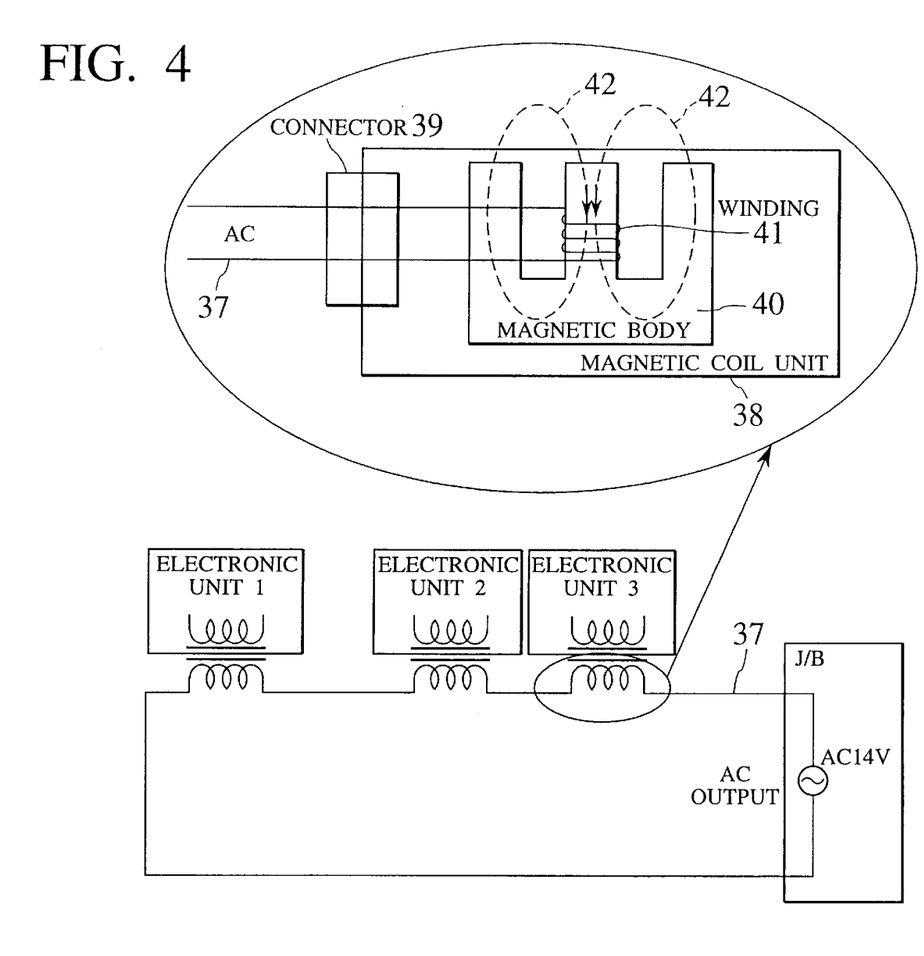
FIG. 4 is an explanatory diagram for explaining an example of use of AC output in a DC—DC converter of this embodiment.

The aforementioned AC14 V is preferred to be used, for example, as shown in FIG. 4. FIG. 4 shows that AC power can be supplied easily without direct contact and the AC14 V generated in the junction box 10 of this embodiment is introduced to the load side via the cable 37. A magnetic coil unit 38 is connected to this cable 37. The magnetic coil unit 38 comprises a connector 39 and a magnetic body 40 and AC14 V copper wire is wound around a central protrusion of the magnetic body 40.

That is, magnetic flux 42 is generated by this winding as shown in FIG. 4. If a circuit (coil, iron core or the like) for detecting this magnetic flux 42 is provided within the electronic unit, the AC14 V can be received by the electronic unit easily.

The battery controller 30 obtains a duty ratio of a control signal for the switching element in the DC-DC converter 28 based on a detected voltage in order to supply the 14 V, 7 V outputs of the DC—DC converter 28 with stability and then turns ON/OFF the switching element.

Further, the battery controller 30 samples currents from the low current system current sensor 26 and high voltage system current sensor 20. If each of these current values exceeds a predetermined value in a predetermined while (for example, 100 micro seconds), it determines that a short-circuit occurs in a load or cable and maintains the high voltage main relay 19 in OFF condition while the switching element is maintained in OFF condition. That is, the supply of the fist voltage to outside and low voltage system systems from the high voltage battery 11 is stopped.

Figure 5A:
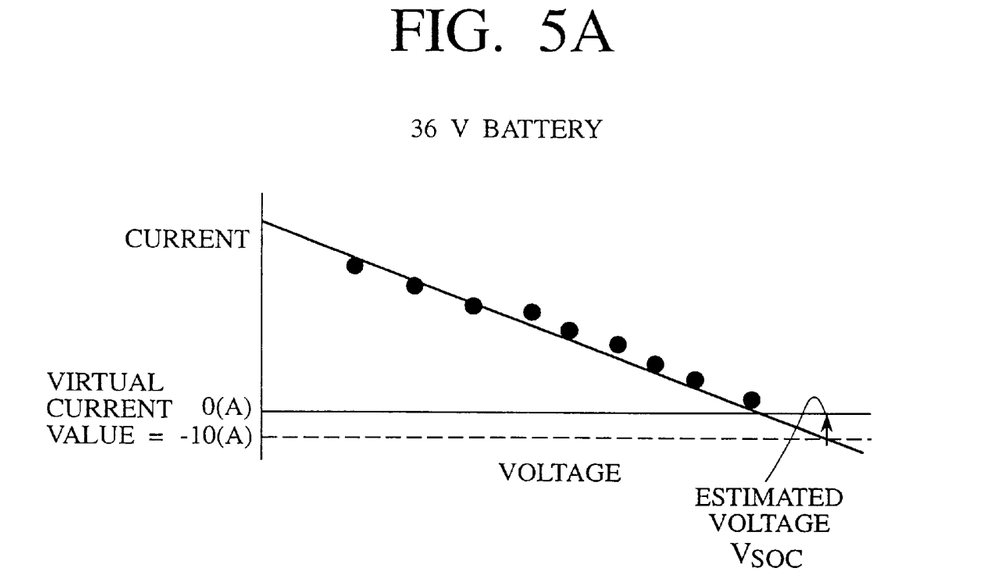
Figure 5B:
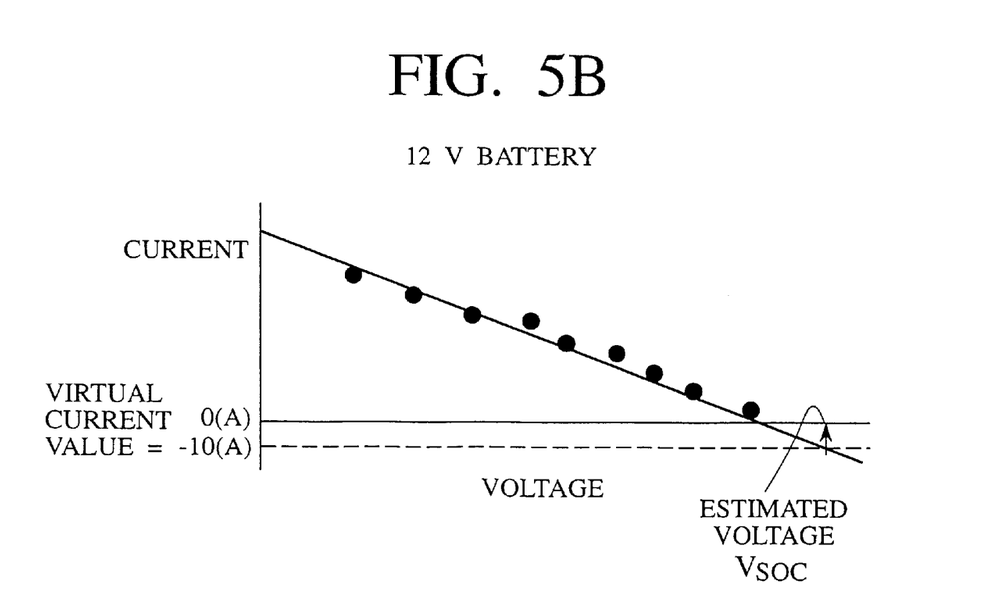

Further, the battery controller 30 measures a remaining capacity of each of the batteries from voltage and current from the high voltage system and low current system as shown in FIGS. 5A, 5B.

FIG. 5A shows a method for measuring the remaining capacity of the 36 V battery 11 and FIG. 5B shows a method for measuring the remaining capacity of the 12 V battery 13. These Figures indicate that two base systems carry out processing in parallel.

That is, the battery remaining capacity measuring function is comprised of high voltage battery remaining capacity measuring function and low voltage battery remaining capacity measuring function. Even if a low voltage battery and a high voltage battery coexist in a vehicle, the remaining capacities of both the batteries are estimated at the same time and depending on this estimated value, the high voltage battery 11 is charged by 42 V from the alternator 1 or the low voltage battery 13 is charged by 14 V from the junction box 10 as required.

According to the low current battery remaining capacity measuring function, a low current system current value detected by the current sensor 26 and a low current system voltage obtained through the pattern 29 for low current system sensing are sampled every 500 micro seconds, and when eight pieces of data are collected, they are averaged. Then, 100 pairs of the averaged current data and averaged voltage data are collected. That is, 100 pair data are dispersed such that they descend as they go to the right in coordinate system having current-voltage axes with a passage of time as shown in FIG. 5B.

Then, a linear expression (Y=a·X+b) is obtained based on data of 100 pairs of this averaged current data and averaged voltage data according to least squares method.

Next, an intersection between a predetermined virtual current value (−10 A) and the straight line (Y=a·X+b) is obtained and a voltage value at a point where the normal from this intersection to the voltage axis intersects the voltage axis is obtained as an estimated voltage (VSOC) corresponding to the remaining capacity of the current 12 V battery 13.

If this estimated voltage (VSOC) is low, the battery controller 30 transmits a charge control signal to the alternator 1 in order to maintain a stabilized 12 V during a next traveling of the vehicle, thereby charging the battery 13.

Further, according to the high voltage system battery remaining capacity measuring function, a high voltage system current value detected by the current sensor 20 and a voltage obtained by the insulation type voltage sensor 21 are sampled every 500 micro seconds and when eight pieces of data are collected, they are averaged. Then, 100 pairs of this averaged current data and averaged voltage data are collected. That is, 100 pair data are dispersed such that they descend as they go to the right in the coordinate system having current-voltage axes with a passage of time as shown in FIG. 5A.

Then the linear expression (Y=a·X+b) about the current and voltage is obtained based on data relating to the 100 pairs of the averaged current data and the averaged voltage data according to the least square method.

Next, an intersection between a predetermined virtual current value (−10 A) and the straight line (Y=a·X+b) is obtained and a voltage value at a point where the normal from this intersection to the voltage axis intersects the voltage axis is obtained as an estimated voltage (VSOC) corresponding to the remaining capacity of the current 36 V battery 11.

If this estimated voltage (VSOC) is low, the battery controller 30 transmits a charge control signal to the alternator 1 in order to maintain a stabilized 42 V during a next traveling of the vehicle, thereby charging the battery 11.

Therefore, the junction box 10 comprises control function of the high voltage main relay 19, control function of the DC-DC converter 28, control function of the alternator 1 and battery remaining capacity measuring function (two systems for high and low voltages). Therefore, any protective circuit for over-current does not have to be provided on the load side so that stabilized distribution of electric power to two systems is enabled.

Figure 6:
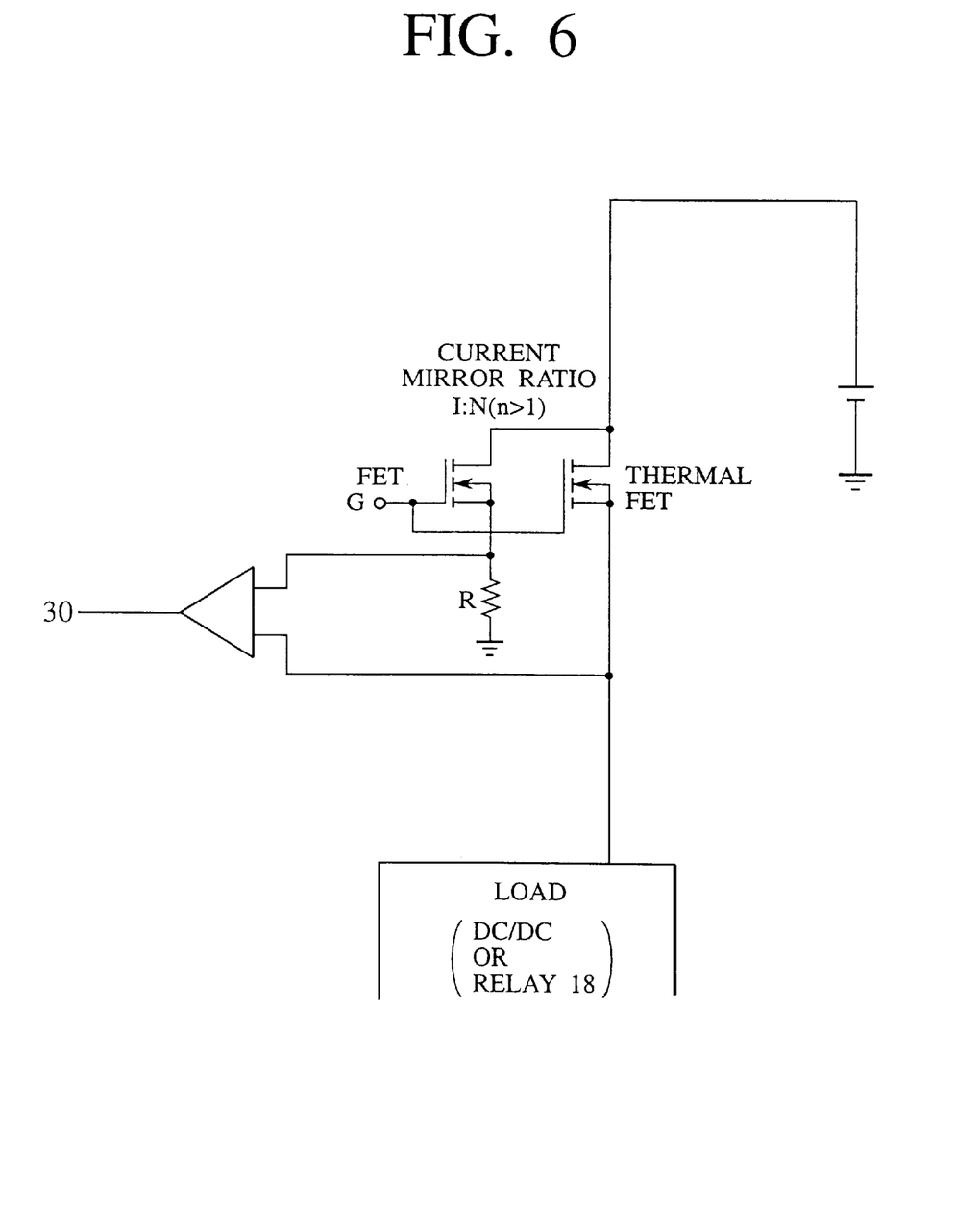
FIG. 6 is a schematic structure diagram of an over-current protective circuit which substitutes the over-voltage countermeasure circuit.

Although according to the above described embodiment, the over-voltage countermeasure circuit is constructed as shown in FIG. 3, it is permissible to connect a thermal FET to FET in parallel as shown in FIG. 6, detect a difference of voltage between the sources thereby detecting a tendency of the over-current, and turn OFF the FETs when it is determined that there is a possibility that a short-circuit occurs. When such a short-circuit occurs, a large current flows through the thermal FET and a high heat is generated by this large current so that the thermal FET is turned OFF.

SECOND EMBODIMENT

Figure 7:
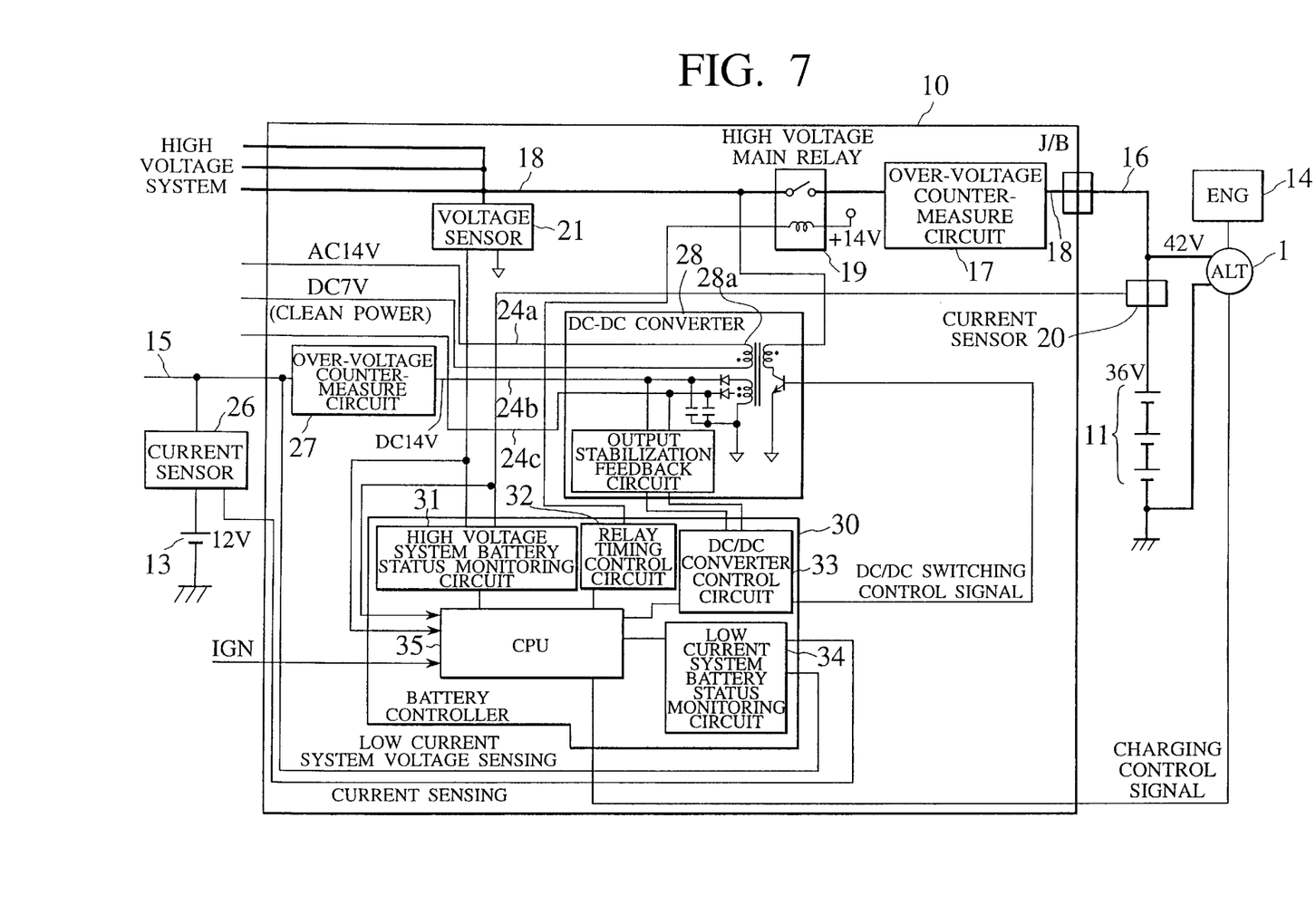
FIG. 7 is a schematic structure diagram of a junction box according to a second embodiment.
Figure 8:
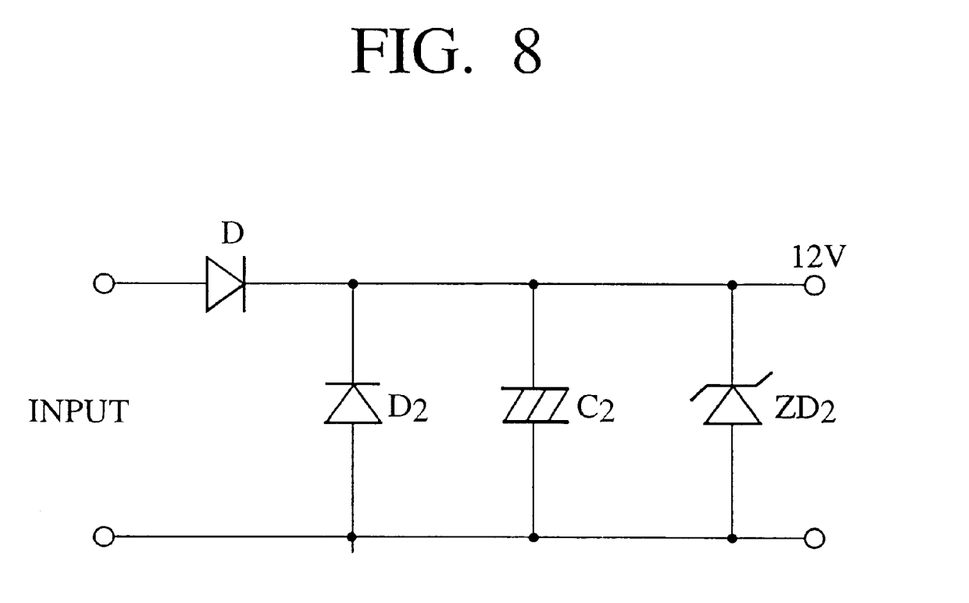
FIG. 8 is a schematic structure diagram of the over-voltage countermeasure circuit for low current used in the second embodiment.

FIG. 7 is a schematic structure diagram of a junction box according to a second embodiment. The junction box 50 shown in the same FIG. 7 is provided with the over-voltage countermeasure circuit 27 for low current. As shown in FIG. 8 for example, the over-voltage countermeasure circuit 27 comprises diodes D1, D2, field capacitor C2, and Zener diode ZD2 (although a resistor, transistor and the like are provided, only main components are indicated in this example). Even if the DC 14 V voltage outputted from the DC-DC converter 28 becomes an over-voltage exceeding 14 V because of abnormality in the low voltage battery 13, 14 V is always maintained so as to protect the low voltage battery 13, load and DC-DC converter 28.

That is, even if the battery 13 or load side exceeds a predetermined voltage because of any abnormality, because the over-voltage countermeasure circuit 27 for low current system is constructed of a Zener diode and the like as shown in FIG. 8, such an over-voltage is suppressed.

This junction box 50 comprises the current sensor 20, the high-voltage countermeasure circuit 17 for high voltage, the high voltage main relay 19, the voltage sensor 21 (insulation type), the DC-DC converter 28 for obtaining plural kinds of low voltages by inputting a first high voltage outputted from the high voltage main relay 19 and the battery controller 30, which are all the same as the first embodiment.

Instead of the over-voltage countermeasure circuit according to the second embodiment, it is permissible to provide with a circuit for preventing an over-current as shown in FIG. 6.

According to the present invention, if the first voltage from the high voltage battery becomes an over-voltage due to abnormality in the load, alternator or the like in the junction box provided between the high voltage battery and load, that over-voltage component is removed, and low charged voltage based on the first voltage and plural kinds of low voltages different from that low charged voltage are generated. Then, the low charged voltage is impressed on a low voltage battery provided in the downstream.

If the first voltage is over a predetermined value at this time, the battery controller stops a supply of the first high voltage or stabilizes an output thereof based on the output voltage of the low voltage system.

Therefore, any protective circuit for an over-current does not have to be provided on the load side, and further, a stabilized electric power can be supplied to the load side.

Because the battery controller in the junction box obtains a remaining capacity of each of the high voltage battery and low voltage battery, even if a high voltage battery and a low voltage battery coexist in a vehicle, the remaining capacities of both the batteries can be estimated in the junction box nearby the batteries. Therefore, the remaining capacities of both the batteries can be known accurately and charging control by the alternator to the battery can be achieved effectively.

It should be understood that many modifications and adaptations of the invention will become apparent to those skilled in the art and it is intended to encompass such obvious modifications and changes in the scope of the claims appended hereto.

What is claimed is:

1. A junction box provided between a high voltage battery and a load and on which a predetermined high voltage is impressed by said high voltage battery, the box comprising:

a high voltage system circuit pattern which receives said predetermined high voltage and supplies to said load;

a high voltage system circuit shut-off relay for shutting off the high voltage system circuit;

a high voltage system voltage/current detecting portion for detecting a voltage impressed on said high voltage system circuit pattern and a current flowing therein;

a voltage converter which receives a voltage from a post stage of said high voltage system circuit shut-off relay of said high voltage system circuit pattern and generates and outputs at least one predetermined low voltage based on the received voltage;

a low voltage circuit pattern which receives said at least one predetermined low voltage and supplies to a low voltage battery and said load;

a low voltage system voltage/current detecting portion for detecting a voltage impressed on the low voltage circuit pattern and a current flowing therein; and a controller for if a current flowing through said high voltage system circuit pattern detected by said high voltage system voltage/current detecting portion is over a first predetermined value or a current flowing through said low voltage system circuit pattern detected by said low voltage system voltage/current detecting portion is over a second predetermined value, controlling said high voltage system shut-off relay to shut off said high voltage system circuit pattern.

2. A junction box according to claim 1 further comprising an over-voltage countermeasure circuit which is provided at a forefront stage of said high voltage system circuit pattern and even if a voltage over a third predetermined value is inputted, outputs said predetermined high voltage to a post stage.

3. A junction box according to claim 1 further comprising an over-voltage countermeasure circuit which is provided at a forefront stage of said high voltage system circuit pattern and even if a voltage over a fourth predetermined value is inputted, outputs said at least one predetermined low voltage to a post stage.

4. A junction box according to claim 1 wherein said controller comprises:

an estimating means for estimating a remaining capacity of said high voltage battery based on a voltage and a current detected by said high voltage system voltage/current detecting portion; and an estimating means for estimating a remaining capacity of said low voltage battery based on a voltage and a current detected by said low voltage system voltage/current detecting portion.

5. A junction box according to claim 4 wherein said controller, if a remaining capacity of said high voltage battery is estimated to be lower than a predetermined value, supplies a control signal for starting charging to an alternator which supplies a charging voltage to said high voltage battery.

6. A junction box according to claim 1 wherein said voltage converter generates and outputs AC low voltage.

* * * * *